United States Patent [19]

Ishii et al.

[11] Patent Number: 4,985,867
[45] Date of Patent: Jan. 15, 1991

[54] SEMICONDUCTOR MEMORY CIRCUIT

[75] Inventors: Toshikazu Ishii, Chiba; Norimitsu Sako, Funabashi, both of Japan

[73] Assignee: Kawasaki Steel Corporation, Japan

[21] Appl. No.: 405,026

[22] Filed: Sep. 11, 1989

[30] Foreign Application Priority Data

Sep. 14, 1988 [JP] Japan ................................. 63-230745
Feb. 20, 1989 [JP] Japan ..................................... 1-39787

[51] Int. Cl.$^5$ .............................................. G11C 7/00
[52] U.S. Cl. ........................................ 365/221; 365/51;
365/72; 365/78; 365/230.08; 365/238.5;
364/900
[58] Field of Search ............... 365/230.08, 238.5, 221,
365/51, 72, 78; 364/900

[56] References Cited

U.S. PATENT DOCUMENTS

| | | | |
|---|---|---|---|
| 4,138,732 | 2/1979 | Suzuki et al. | 364/900 |
| 4,271,480 | 6/1981 | Vinot | 364/900 |
| 4,567,579 | 1/1986 | Patel et al. | 365/238.5 |
| 4,660,181 | 4/1987 | Saito et al. | 365/238.5 |
| 4,675,850 | 6/1987 | Kumanoya et al. | 365/238.5 |
| 4,685,084 | 8/1987 | Canepa | 365/238.5 |
| 4,694,426 | 9/1987 | Mason | 365/78 |
| 4,706,219 | 11/1987 | Miyata et al. | 365/238.5 |
| 4,789,966 | 12/1988 | Ozaki | 365/238.5 |
| 4,876,671 | 10/1989 | Norwood et al. | 365/230.09 |
| 4,907,203 | 3/1990 | Wada et al. | 365/230.09 |

FOREIGN PATENT DOCUMENTS 63-64698  3/1988  Japan ................................. 365/238.5

*Primary Examiner*—Joseph E. Clawson, Jr.
*Attorney, Agent, or Firm*—Oliff & Berridge

[57] ABSTRACT

There is provided a semiconductor memory circuit, which is capable of changing the number of bits per word thereof and of switching between a RAM function and a FIFO function, by an external control signal, changing an effective data length and an effective address length on the basis of the selected bit construction, and counting up the write address or the read address at each writing and read out when the FIFO function has been selected.

9 Claims, 3 Drawing Sheets

SEMICONDUCTOR MEMORY CIRCUIT

BACKGROUND OF THE INVENTION

1. Field of the Invention

This invention relates to a semiconducter memory circuit, capable of changing the numbers of bits and words thereof, and more specifically to a multifunctional and general purpose semiconductor memory circuit which permits a user to electrically program an arbitrary logic circuit at his hand and which is most preferable for use in a programmable logic device.

2. Description of the Prior Art

There is a conventionally known programmable logic device (hereinafter simply referred to as a PLD), that is an integrated circuit with which a user can construct an arbitrary logic circuit at his hand.

The PLD primarily includes a programmable logic element (hereinafter simply referred to as a PLE) which is configurable to establish a user's own logic, a circuit function-defining memory cell for defining the logic function of the PLE and a connection relationship among internal wirings, a programmable input/output block (hereinafter simply referred to as an IOB) for interfacing between external device packaging pins and an internal logic circuit (i.e., the PLE), and a programmable wiring for establishing a wiring path to connect input/ouput signals into/from the IOB and the PLE to a desired network.

A semiconductor memory circuit for use in such a PLD is desirably variable in the numbers of bits and words meeting a user's wishes. However, such a prior memory circuit comprised of a gate array is impossible to change those numbers of bits and words after the wiring, even if they are variable upon wiring. To solve this, the memory circuit is obliged to have larger numbers of such bits and words, allowing unnecessary memory cells to be increased, followed by reduction of the degree of integration of the PLD and lowering of the utility of the memory circuit.

SUMMARY OF THE INVENTION

In view of the drawbacks of the prior memory circuits, it is an object of the present invention to provide a multifunctional and highly flexible semiconductor memory circuit which is capable of utilizing to the utmost the infinite number of the memory cells and which is switched to serve as an ordinary random access memory (hereinafter simply referred to as a RAM) as well as a first-in first-out memory (hereinafter simply referred to as a FIFO) on the basis of an external control signal.

To achieve the above object, a semiconductor memory circuit according to the present invention is capable of changing the numbers of bits and words thereof, comprising: chip control means for at least selecting the number of bits of one word and switching between a random access memory function and a first-in first-out memory function; an adddress buffer having a function to alter an effective address length on the basis of a selected bit construction; an address counter for counting up a write address or a read address in each write or read operation when the first-in first-out memory function has been selected; a memory cell array; column and line decoders each for controlling said memory cell array on the basis of the selected bit construction; and an input/output buffer having a function to change an effective data length on the basis of the selected bit construction.

In one aspect of the present invention, the write and read operations are independently executable when the first-in first-out memory function has been selected.

In another aspect of the present invention, the memory circuit is programmable by itself as to whether or not it is used.

In still another aspect of the present invention, the memory circuit further includes an input/output selection switch for enabling at least part of an input of the chip control means, an input of the address buffer, and inputs and outputs of the input/output buffer to be selected.

In accordance with the present invention, the number of bits consituting one word is changeable on the basis of an external control signal, and the random access memory function and the first-in first-out memory function are switchable. A bit construction in the same integrated circuit can accordingly be changed by an external control signal, allowing the finite number of memory cells to be utilized to the utmost. The present memory circuit is switchable by an external control signal either to an ordianry random access memory or to a first-in first-out memory in which older data first disappears among stored data when it overflows, thereby improving multifunctional and general-purpose properties.

In accordance with the present invention, write and read operations are respectively independently executable when the first-in first-out memory function has been selected. Hereby, sequential read and write operations are made possible, further improving multifunctional and general-purpose properties.

Additionally, in accorddance with the present invention, the present memory circuit is programmable by itself as to whether it is used or not. It is accordingly not needed, when the present memory circuit is not used, to instruct that fact through an external instruction input, allowing an instruction line for the just-mentioned external input to be available for another application, followed by further improvement of multifunctional and general-purpose properties.

Furthermore, in accordance with the present invention, the input/ouput selection switch is provided for making selectable at least part of an input of the chip control means, an input of the address buffer, and inputs and outputs of the input/output buffer. Accordingly, at least part of the input of the chip control means, the input of the address buffer, and the inputs and outputs of the input/output buffer can directly be connected to another line in the PLD other than a general line in the same PLD which is ordinarily used, such for example as a long line, a bus, or an input/output buffer, etc., allowing the general line to be employed for other applications, followed by further improvement of multifunctional and general-purpose properties. Particularly, when the input/output buffer is made selectable, direct input/output connection to the outside is possible.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar part throughout the figures thereof and wherein.

DESCRIPTION OF THE BEST MODES

In the following, preferred embodiments of a semiconductor memory circuit according to the present invention will be described with reference to the accompanying drawings.

In a first embodiment of the present invention, an 8 kbit semiconductor memory circuit will be taken as an illustrative example to which the present invention is applied.

Figure 1:
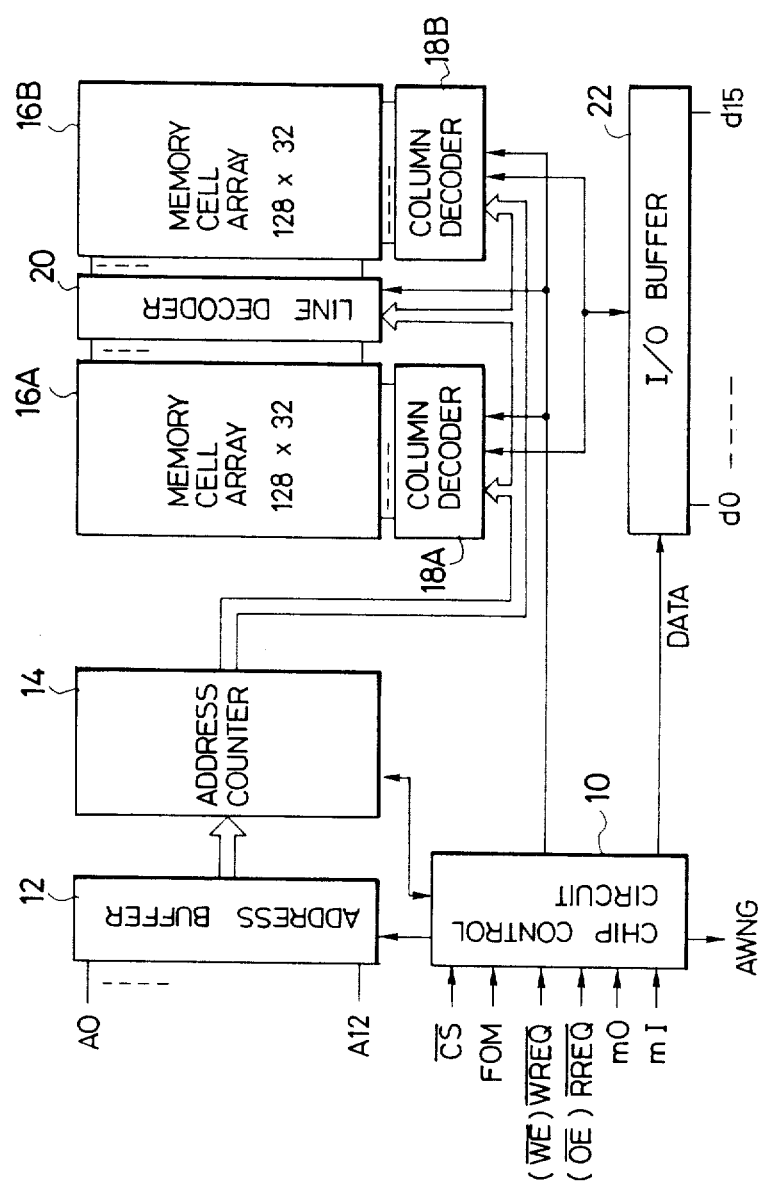
FIG. 1 is a block diagram illustrating the arrangement of a first embodiment of a semiconductor memory circuit according to the present invention.

The circuit includes, as illustrated in FIG. 1, a chip control circuit 10 for deciding whether the circuit is to be used or not, and selecting memory function (RAM mode or FIFO mode), and the number of bits per word on the basis of external control signals $\overline{CS}$, FOM, m0 and m1, and further receiving an external write designation (request) signal $\overline{WREQ}$ and a read designation (request) signal $\overline{RREQ}$, etc., an address buffer 12 having a function to select an effective address length among address inputs A0–A12 set in conformity with the longest bit arrangement, on the basis of a bit construction assigned by the chip control circuit 10, an address counter 14 for counting up a write address or a read address at each write or read operation when the first-in first-out (FIFO) mode has been selected by the chip control circuit 10, memory cell arrays 16A, 16B composed of two blocks, each of which block including 128×32 memory cells, column decoders 18A, 18B having functions of a sense amplifier and a write/read circuit, for controlling the memory cell arrays 16A, 16B on the basis of the bit construction assigned by the chip control circuit 10, a line decoder 20 having same functions as the column decoders 18A, 18B, and an input/output (I/O) buffer 22 for selecting an effective data length based on the bit construction assigned by the chip control circuit 10.

The chip control circuit 10 includes an input terminal for receiving a chip select signal $\overline{CS}$ for selecting whether the present whole chip is to be used or not, an input terminal for receiving a mode control signal FOM which is to select whether the whole chip is operated with the ordinary (S) RAM mode or with the FIFO mode, input terminals for respectively receiving an external write request signal $\overline{WREQ}$ and a read request signal $\overline{RREQ}$ when the FIFO mode has been selected, and for respectively receiving a write enable signal $\overline{WE}$ for opening an input buffer and an output enable signal $\overline{OE}$ for opening an output buffer when the RAM mode has been selected, input terminals for respectively receiving bit length select signals m0, m1 for selecting the number of bits per word, and an output terminal for issuing an alarm signal AWNG as it is found that a read address among addresses of the address counter 14 is coincident with an address +1 which has been written recently when the FIFO mode has been selected, i.e., when an address, which has not yet been written with any information, is assigned. Here, each overlined "−"

signal means that the signal is true when it is at a "0" level (low level).

The mode control signal FOM can be set to select the ordinary RAM mode when it is "0," for example, while selecting the FIFO mode when it is a "1".

The bit length select signals m0, m1 can be set to select 1 bit per word when they are "0, 0", 4 bits per word when "1, 0", 8 bits per word when "0,1", and 16 bits per word when "1, 1", as listed in Table 1.

TABLE 1

| bit length select signal | | bit construction | memory capacity |
|---|---|---|---|
| m1 | m0 | (bit/word) | (words) |
| 0 | 0 | 1 | 8192 |
| 0 | 1 | 4 | 2048 |
| 1 | 0 | 8 | 1024 |
| 1 | 1 | 16 | 512 |

The address buffer 12 selects an effective address length among address inputs A0–A12 on the basis of the bit length control signal entered through the chip control circuit 10. In fact, all the address inputs A0–A12 are valid when the bit length select signals m0, m1 are "0, 0", the address inputs A0–A10 are valid when "1, 0", A0–A9 are valid when "0, 1", and A0–A8 are valid when "1, 1".

The address counter 14 counts up the write address and the read address at each write and read operation when the FIFO mode has been selected on the basis of the control signal entered through the chip control circuit 10.

The chip control circuit 10 monitors counted values by the address counter 14, and issues the alarm signal AWNG when an address, which has not yet been written with any information, is assigned for reading. Since in the present embodiment the alarm signal AWNG is issued on the basis of the counted value by the address counter 14 in the memory circuit, the arrangement of the memory circuit is very simplified compared with a prior case where such an alarm signal is issued on the basis of an external signal and the like. However, this function of issuing the alarm signal AWNG can be dispensed with.

It is noticed here that when the RAM mode is selected, any input signal simply passes through the address counter 14.

The column decoders 18A, 18B and the line decoder 20 control address and data lines in the memory cell arrays 16A, 16B based upon the bit length assigned by the chip control circuit 10.

The input/output (I/O) buffer 22 selects an effective data length, on the basis of the bit construction assigned by the chip control circuit 10.

Now, it should be understand that although in the above embodiment the paired memory cell arrays 16A, 16B were provided and the two paired column decoders 18A, 18B were correspondingly provided, the column decoders 18A, 18B may be united integrally for common use, and the configuration of the memory cell may not be limited to such a paired one.

Figure 2:
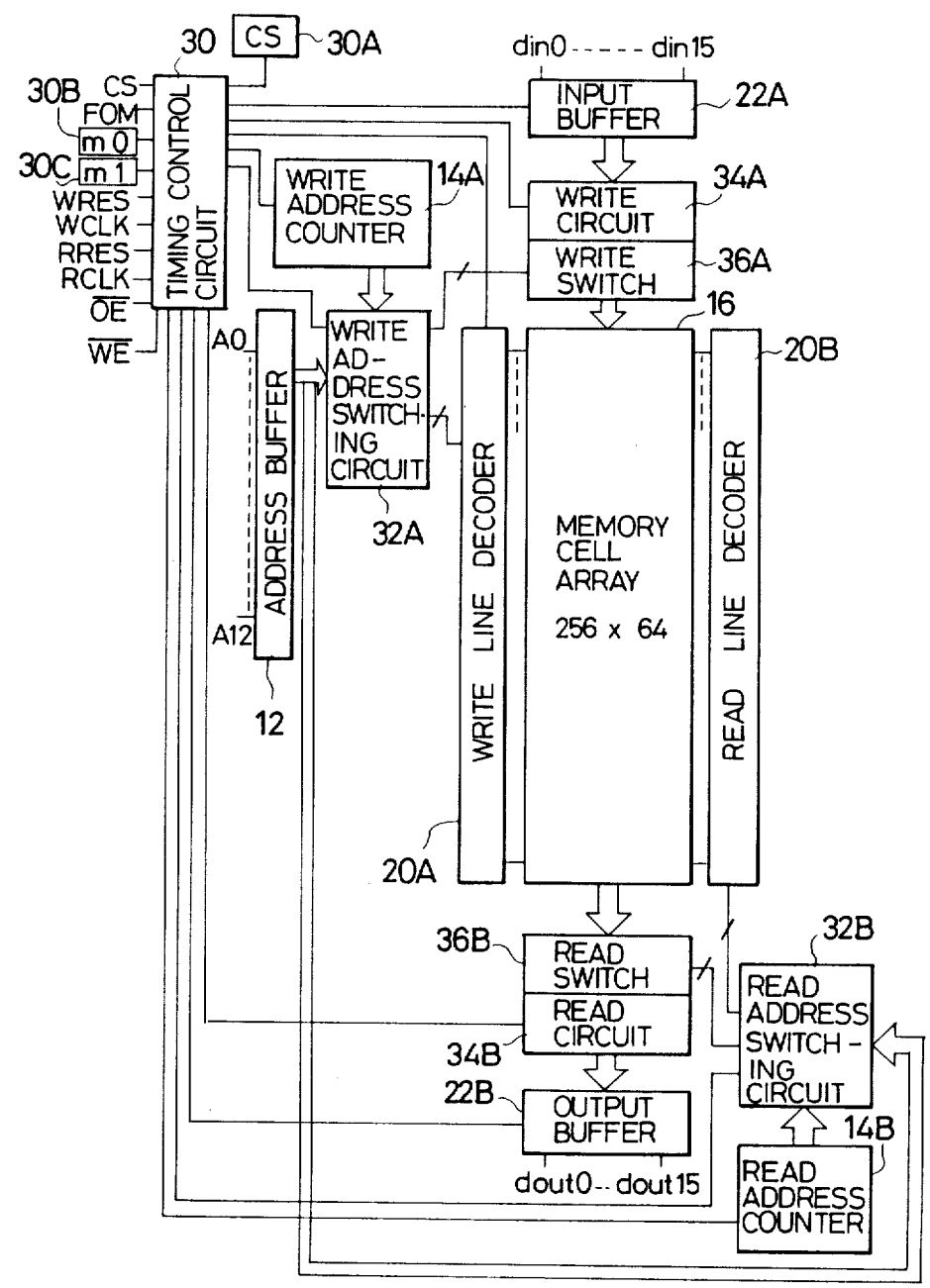
FIG. 2 is a block diagram illustrating the arrangement of a second embodiment of the same.

In succession, a second embodiment of the semiconductor memory circuit according to the present invention will be described with reference to FIG. 2.

The second embodiment includes additionally and independently, in the same semiconductor memory circuit as in the first embodiment, a write address counter 14A and a read address counter 14B, a write circuit 34A and a write switch 36A both constituting the write column decoder, a read switch 36B and a read circuit 34B both constituting the read column decoder, an input buffer 22A and an output buffer 22B, for the purpose of assuring independent write and read operations when the FIFO mode has been selected.

Correspondingly, the chip control circuit includes a timing control circuit 30 for receiving external control signals, a write address switching circuit 32A, and a read address switching circuit 32B.

In addition, the write and read operations are executed respectively by independent signals WRES, WCLK and RRES, RCLK. Here, WRES and RRES are write and read reset signals, respectively, and WCLK and RCLK are write and read clock pulse signals, respectively.

In the timing control circuit 30, the chip select signal CS can be entered externally as in the first embodiment and further can also be set through a programming memory 30A. Hereby, the present memory circuit can be programmed as to whether it is used or not in itself, upon programming the whole PLD. Accordingly, if the programming memory 30A is programmed to be "1" in its status, then the external CS signal is valid, enabling the present memory circuit depending upon the status of the CS signal. In contrast, if the programming memory 30A is programmed to be "0", then the external CS signal is invalid, prohibiting the present memory circuit from being used at all times. The just-mentioned situation assures, when the present memory circuit is not used, the use of an instruction line for the external input to other applications because there is no need of successively instructing externally that the circuit is not to be used, thereby further improving multifunctional and general-purpose properties of the circuit.

In the timing control circuit 30, the bit length select signals m0, m1 for selecting the number of bits per word can also be set in programming memories 30B, 30C during the programming of the whole PLD.

Figure 3:
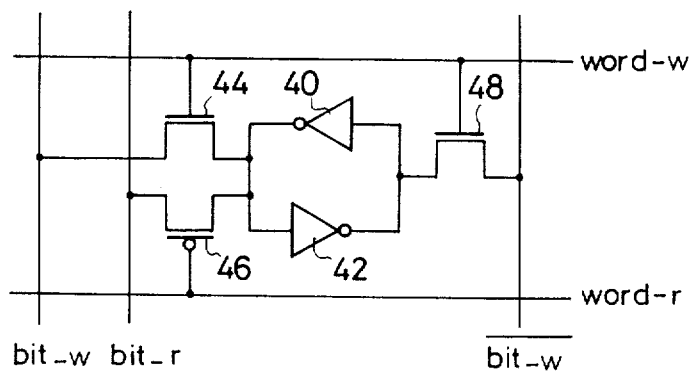
FIG. 3 is a circuit diagram illustrating the arrangement of a memory cell for use in the second embodiment.

The memory cell array 16 is here integrally constructed, differeing from the case in the first embodiment. Each memory cell constituting the memory cell array 16 comprises a static RAM, which includes as illustrated in FIG. 3 for example, two information holding inverters 40, 42 and three selection transistors 44, 46, 48 for connection and separation between the memory cell and bit lines "bit" in conformity with a voltage level of word lines "word". To realize the write and read operations independently, the word lines "word" and the bit lines "bit" are independently provided for writing (word-w, bit - w, bit - w) and read out (word - r, bit - r).

In the present embodiment, when the mode control signal FOM is "0" for example, the ordinary RAM mode is selected and the address switching circuits 32A, 32B make valid the address inputs A0-A12 from the address buffer 12 valid. In contrast, when the mode control signal FOM is "1" for example, the FIFO mode is selected and the address switching circuits 32A, 32B make the address inputs from the write and read address counters 14A, 14B valid.

Additionally, if the write and read addresses are coincident with each other, then writing has priority.

Further, if the write address is filled up in writing, then the writing is interrupted, and if the write reset signal WRES is entered, then the writing is restarted from the oldest address, for example.

For other details, the description in the first embodiment is available and will be omitted here.

In the present embodiment, the writing and the read out are independently executable in the FIFO mode, and hence successive operations are made possible, further improving multifunctional and general-purpose porperties.

In succession, a third embodiment of the present invention will be described with reference to FIG. 4.

Figure 4:
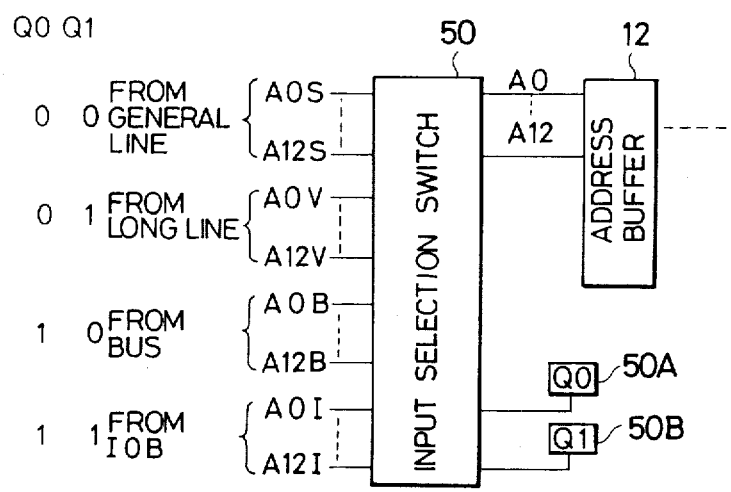
FIG. 4 is a block diagram illustrating an input/output selection switch for use in a third embodiment.

The present embodiment additionally includes, in the same semiconductor memory circuit as the second embodiment, an input (output) selection switch 50 disposed on the input side of the address buffer 12, on the input side of the timing control circuit 30, on the input side of the input buffer 22A, and on the output side of the output buffer 22B, as illustrated for example in FIG. 4 for the input side of the address buffer 12.

Referring to FIG. 4, the input selection switch 50 disposed on the input side of the address buffer 12 for selecting the address lines is illustrated. The switch 50 assures the connection, to the address buffer 12, of any one of a number of lines, besides the general lines A0S-A12S located in the typical PLD including, long lines A0V-A12V, buses A0B-A12B, and input/output blocks (IOB) A0I-A12I. Selection of such connection lines is effected upon programming for the whole PLD by setting memory values Q0, Q1 in programming memories 50A, 50B upon the programming of the whole PLD. For example, if the memory values Q0, Q1 in the programming memories 50A, 50B are "0, 0", then the general lines A0S-A12S are selected, if "0, 1", then the long lines A0V-A12V are selected, if "1, 0", then the buses A0B-A12B selected, and if "1, 1", then IOB A0I-A12I are selected.

Although the same input (output) selection switches are additionally provided on the input side of the timing control circuit 30, on the input side of the input buffer 22A, and on the output side of the output buffer 22B, the detailed description will be omitted here.

In the present embodiment, the input (except for the bit length select signals m0, m1) lines of the timing control circuit 30, the input lines of the address buffer 12, the input lines of the input buffer 22A, and the output lines of the output buffer 22B are made selectable, so that any association input/output signal can directly be inputted and outputted into and from the long line, bus, and IOB, etc., other than the general line in the typical PLD, and use of the general line to other applications is assured, further improving the multifunctional and general-purpose properties of the present memory circuit. In particular, when the IOB is made selectable, direct inputs and outputs from and to the outside is assured.

It should now be understood that although in the present embodiment all of the input of the address buffer 12, input of the timing control circuit 30, input of the input buffer 22A, and output of the output buffer 22B were made selectable, any part of those input and output may be fixed and the input (output) selection switch may be omitted.

Furthermore, although in the present embodiment, the input (output) selection switch was combined with the circuit of the second embodiment, the input (output) selection switch may be combined with the circuit of the first embodiment.

Although certain preferred embodiments have been shown and described, it should be understood thus many changes and modifications may be made therein without departing from the scope of the appended claims.

What is claimed is:

1. A semiconductor memory circuit capable of changing the numbers of bits and words associated therewith, the circuit comprising:
   chip control means for at least selecting a bit construction corresponding to the number of bits per word and for switching between a random access memory function and a first-in first-out memory function;
   an address buffer for altering an effective address length on the basis of the selected bit construction;
   an address counter for counting up a write address or a read address in each write or read operation when the first-in first-out memory function has been selected;
   a memory cell array;
   column and line decoders each for controlling said memory cell array on the basis of the selected bit construction; and
   an input/output for changing an effective data length on the basis of the selected bit construction.

2. A circuit according to claim 1 wherein the write and read operations are independently executable when the first-in first-out memory function has been selected.

3. A circuit according to claim 1 wherein it is programmable whether the memory circuit itself is to be used or not.

4. A circuit according to claim 1 wherein it further comprises an input/output selection switch for enabling at least part of an input of said address buffer, and inputs and outputs of said input/output buffer to be selected.

5. A circuit according to claim 1 wherein said chip control means monitors counted values by said address counter, and issues an alarm signal when an address for which no information has been written is assigned for read out.

6. A semiconductor memory circuit capable of changing the number of bits and words associated therewith, the circuit comprising:
   timing control means at least for selecting a bit construction corresponding to the number of bits per word and for switching between a random access memory function and a first-in first-out memory function;
   an address buffer for changing an effective address length based on the selected bit construction;
   a write address counter and a read address counter separate from said write address counter for independently counting up write and read addresses each write and read operation when the first-in first-out memory function has been selected;
   write address switching means for making valid an address input from said address buffer when the random access memory function has been selected, while making valid an address input from said write address counter when the first-in first-out memory function has been selected;
   read address switching means for making valid an address input from said address buffer when the random access memory function has been selected, while making valid an address input from said read address counter when the first-in first-out memory function has been selected;
   an input buffer and an output buffer separate from said input buffer, said input and output buffers cooperatively having a function to change an effective data length based upon the selected bit construction;
   a memory cell array;
   write column and line decoders for controlling said memory cell array based upon the selected bit construction; and
   read column and line decoders for controlling said memory cell array based upon the selected bit construction.

7. A circuit according to claim 6 wherein said memory cell array comprises a plurality of memory cells interconnected by bit lines and word lines, and each memory cell of said memory cell array is a static random access memory comprising inverters for holding information, and selection transistors for connecting and disconnecting each memory cell to and from the associated bit lines in conformity with signal levels on the associated word lines, and separate word lines and bit lines are provided for write and read operations.

8. A circuit according to claim 6 wherein when the write address and the read address are coincident with each other, a write operation has priority to be executed.

9. A circuit according to claim 6 wherein the write operation is interrupted when the write address counter contains a maximum count at the time of the write operation, and the write operation is restarted from the oldest address when a write reset signal is entered.

* * * * *